(12) United States Patent
Okayasu

(10) Patent No.: US 6,257,771 B1
(45) Date of Patent: Jul. 10, 2001

(54) OPITCAL/ELECTRICAL HYBRID WIRING BOARD AND ITS MANUFACTURING METHOD

(75) Inventor: Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/077,989

(22) PCT Filed: Oct. 15, 1997

(86) PCT No.: PCT/JP97/03715

§ 371 Date: Jun. 12, 1998

§ 102(e) Date: Jun. 12, 1998

(87) PCT Pub. No.: WO98/18301

PCT Pub. Date: Apr. 30, 1998

(30) Foreign Application Priority Data

Oct. 17, 1996 (JP) .................................................... 8-274700

(51) Int. Cl.[7] ..................................................... G02B 6/43
(52) U.S. Cl. ................................ 385/89; 385/59; 385/75; 385/92
(58) Field of Search .................................. 385/88, 89, 92, 385/93, 55, 56, 58, 59, 73, 75, 137, 14; 361/728, 729, 732, 736, 737, 740, 741, 747, 748, 752, 756, 784, 785, 788

(56) References Cited

U.S. PATENT DOCUMENTS

| 4,465,333 | * | 8/1984 | Caserta et al. | 385/73 |
|---|---|---|---|---|
| 4,966,430 | * | 10/1990 | Weidel | 385/14 |
| 5,125,054 | * | 6/1992 | Ackley et al. | 385/49 |
| 5,155,785 | * | 10/1992 | Holland et al. | 385/89 |
| 5,204,925 | * | 4/1993 | Bonanni et al. | 385/89 |
| 5,292,390 | * | 3/1994 | Burack et al. | 156/176 |
| 5,394,490 | * | 2/1995 | Kato et al. | 385/14 |
| 5,488,682 | * | 1/1996 | Sauter et al. | 385/53 |
| 5,835,646 | * | 11/1998 | Yoshimura et al. | 385/14 |

FOREIGN PATENT DOCUMENTS

| 4-51165 | 4/1992 | (JP) . |
|---|---|---|
| 5-66312 | 3/1993 | (JP) . |
| 5-281429 | 10/1993 | (JP) . |
| 7-198973 | 8/1995 | (JP) . |

* cited by examiner

*Primary Examiner*—Rodney Bovernick
*Assistant Examiner*—Michael Stahl
(74) *Attorney, Agent, or Firm*—Gallagher & Lathrop; David N. Lathrop

(57) ABSTRACT

An optical fiber-embedded layer is provided as one layer of a multiple-layered electrical wiring board comprising a mother board having an electrical circuit mounted therein. The optical fiber-embedded layer is formed through its surface with an aperture to expose first ends of the optical fibers where a 45° reflecting surface is provided so that the light exiting from the optical fibers is reflected in a direction orthogonal to the plane of the wiring board and input into the ends of optical fibers at an end face of a daughter board. Light exiting from the ends of optical fibers at the end face of the daughter board and entering the 45° reflecting surface may be input into the optical fibers in the optical fiber-embedded layer.

18 Claims, 9 Drawing Sheets

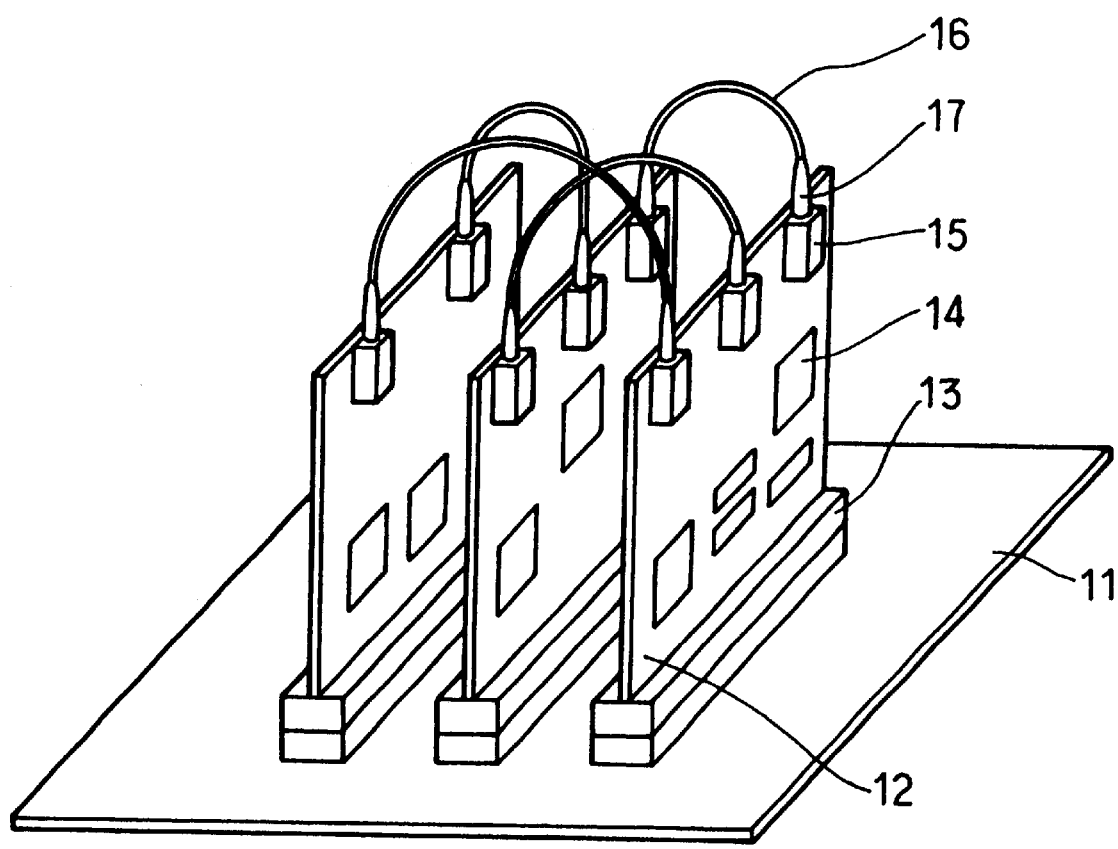
FIG._1
*(PRIOR ART)*

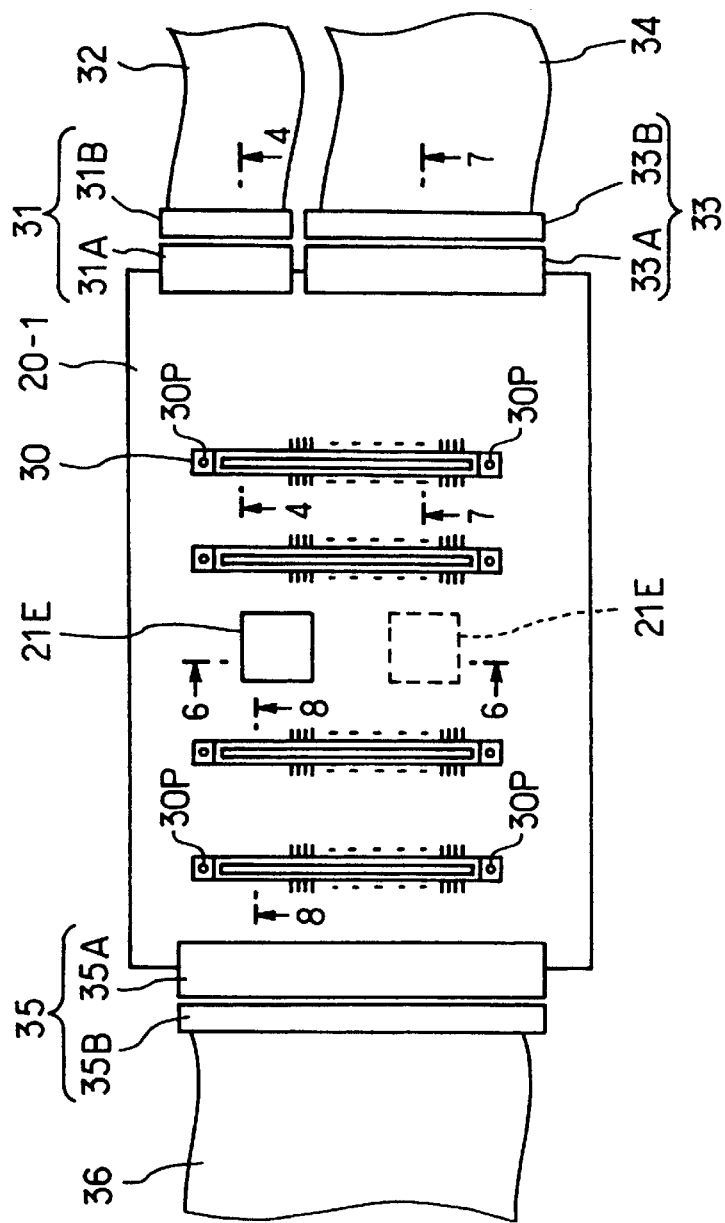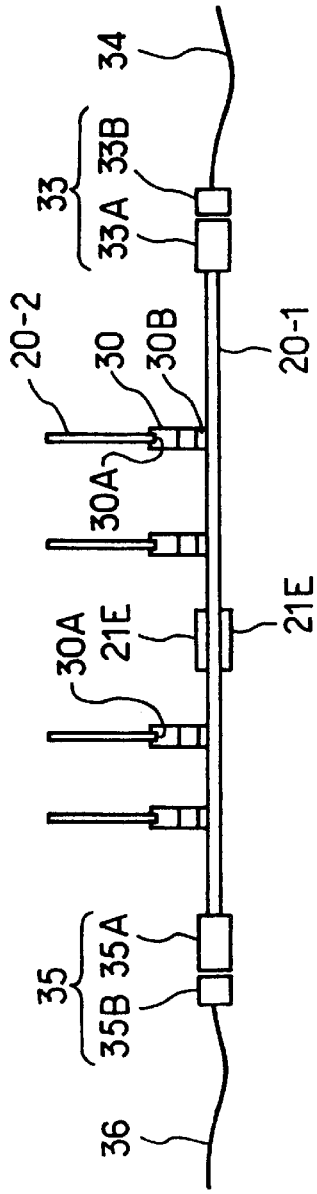

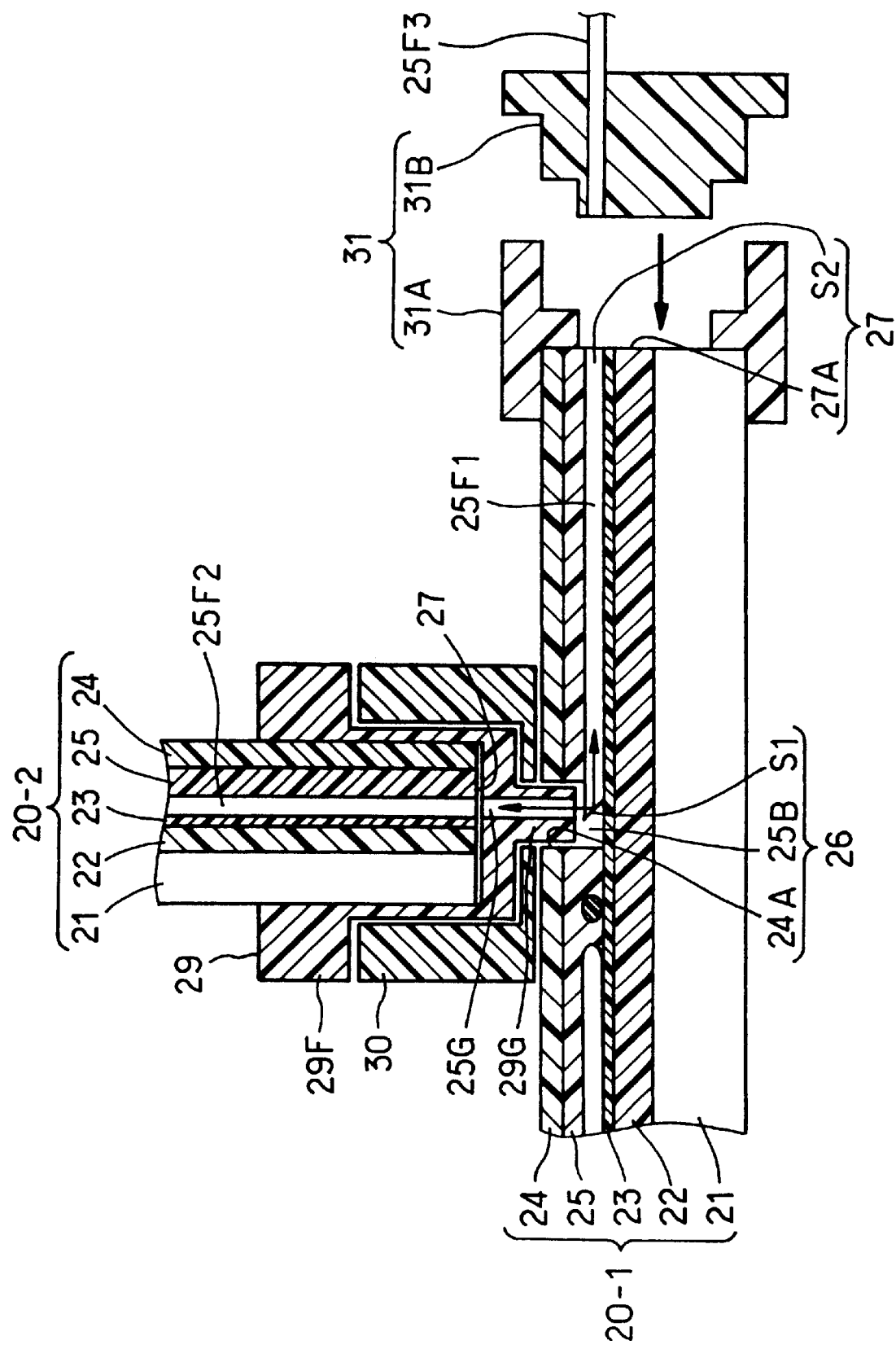
FIG._4

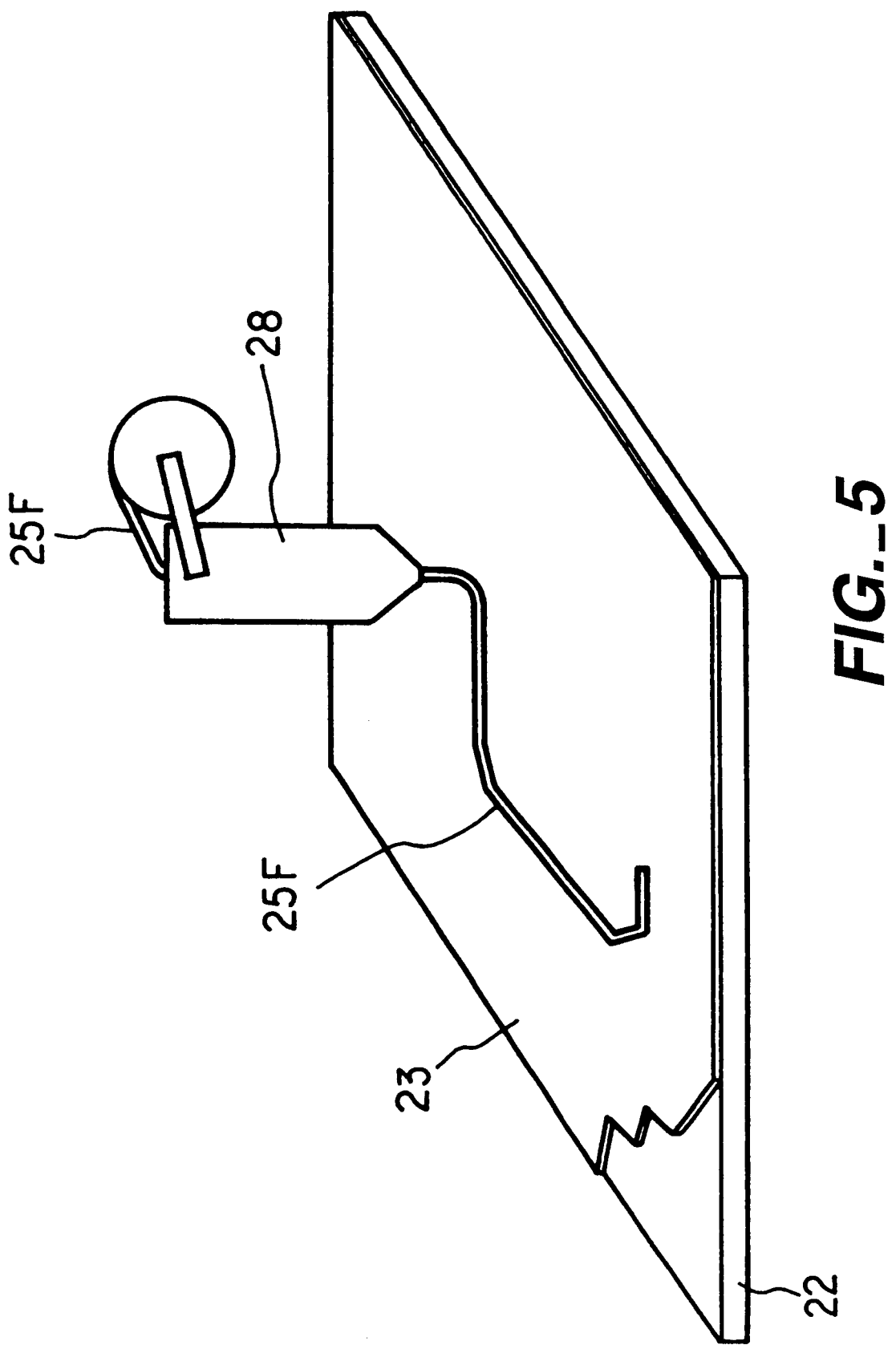
FIG._5

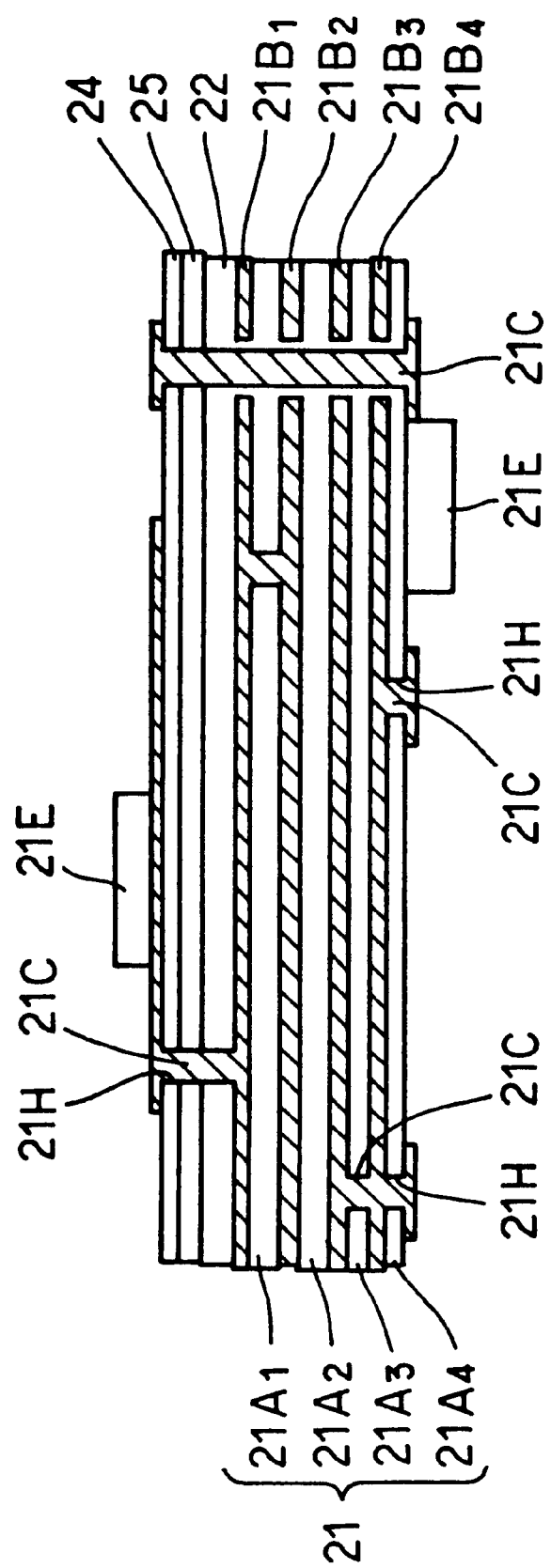
FIG._6

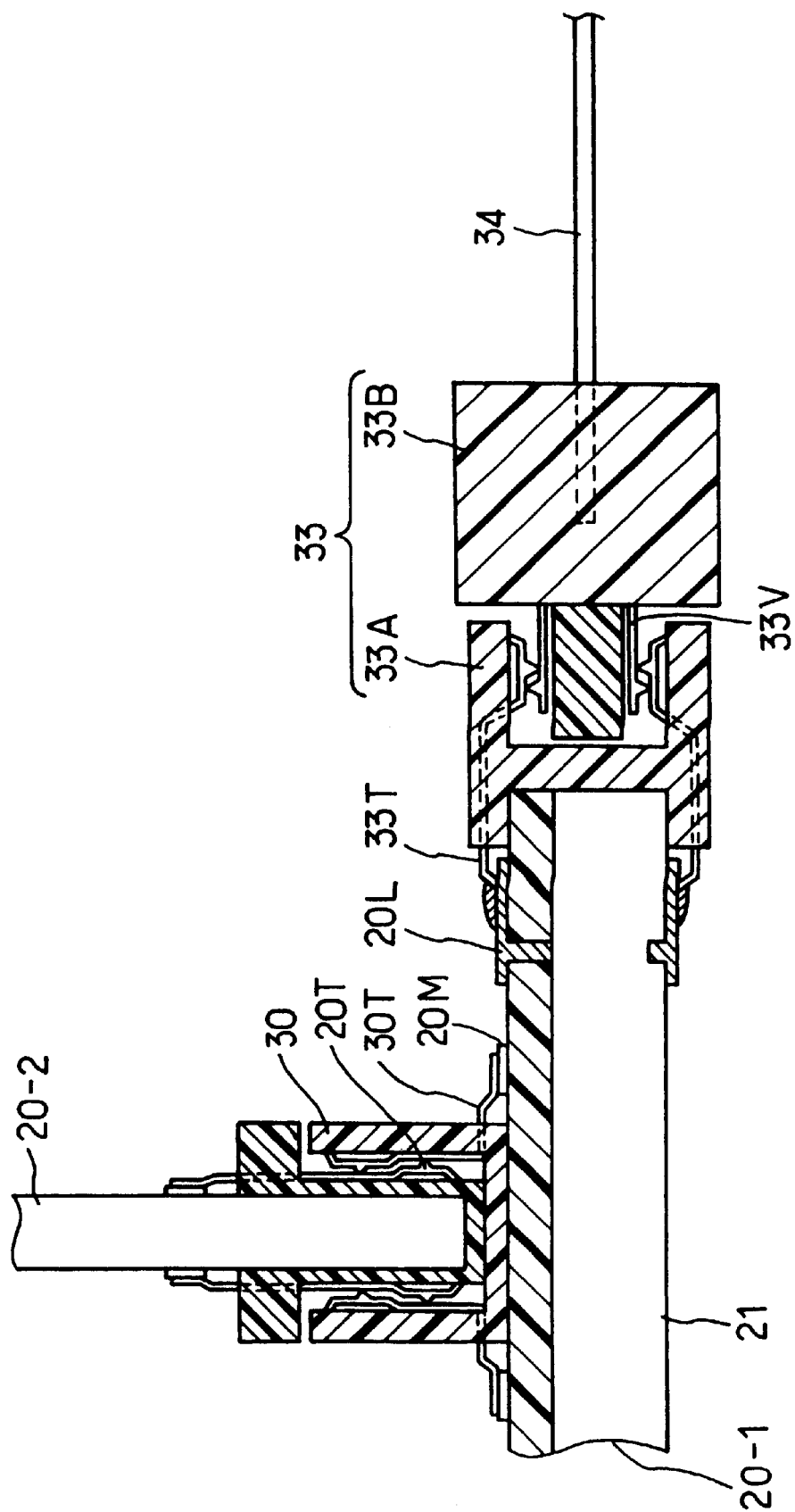
FIG._7

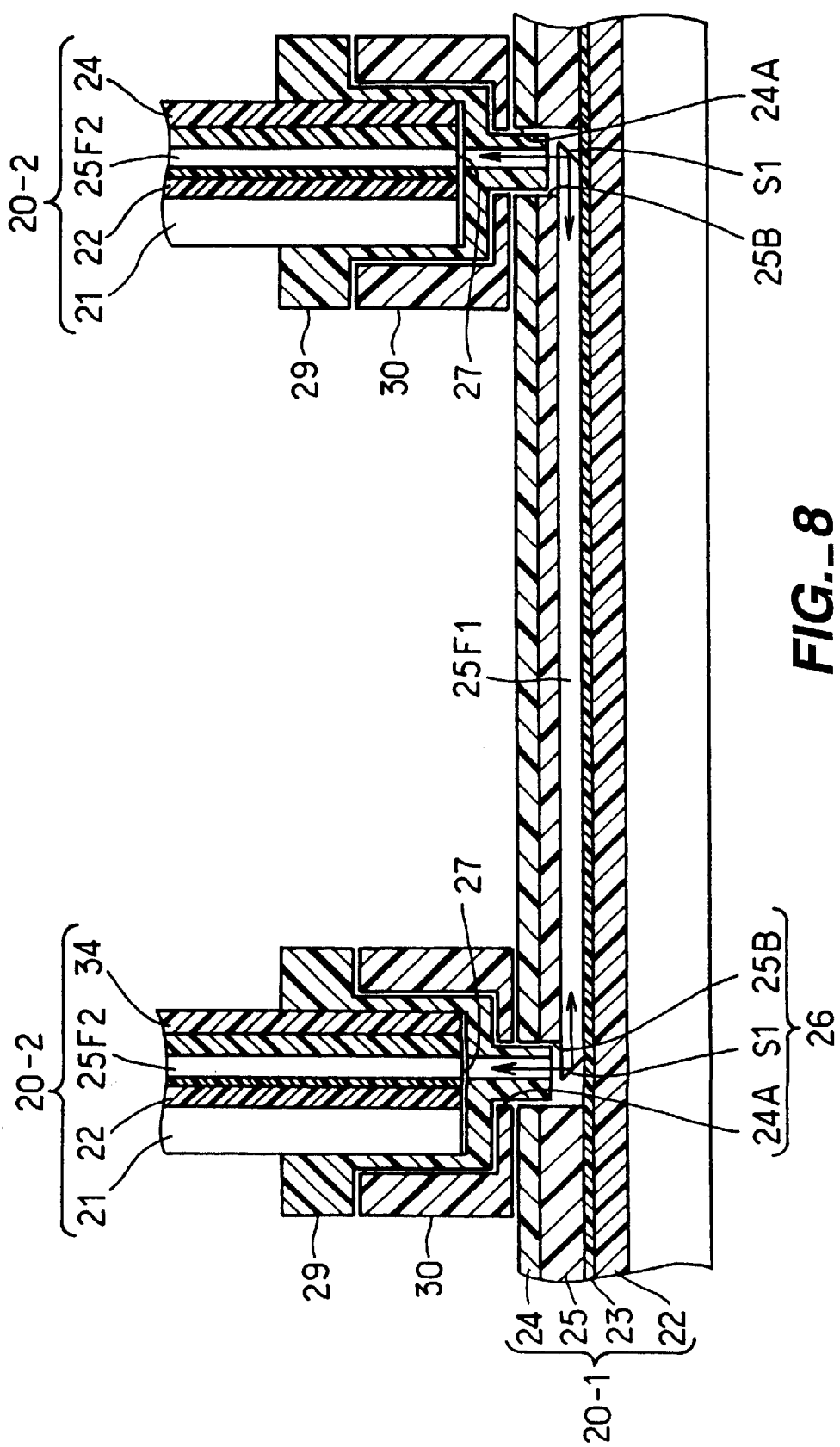
FIG._8

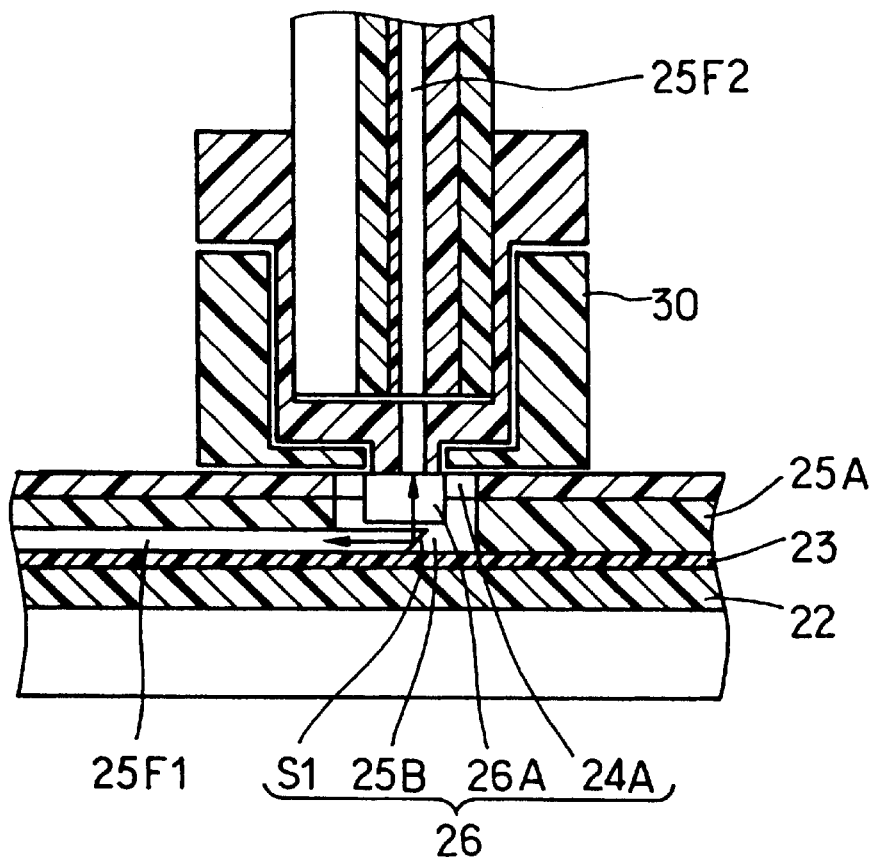
FIG._9
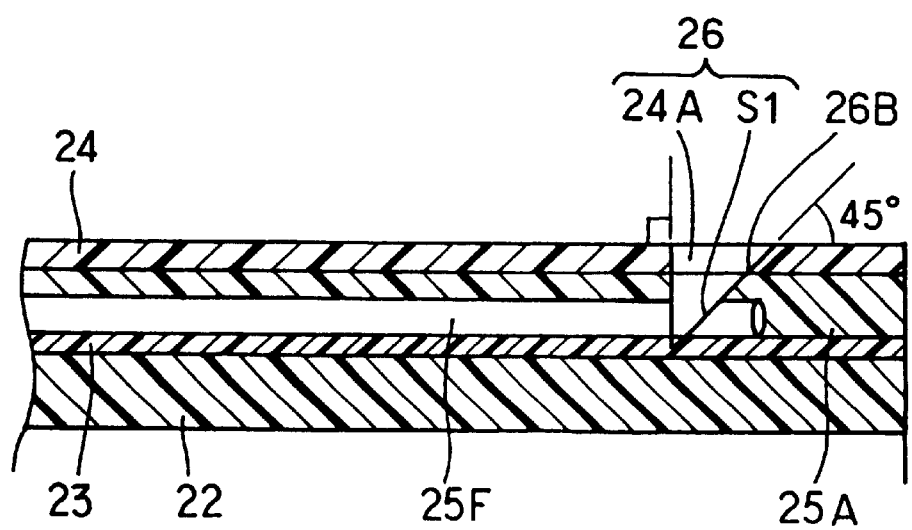
FIG._10

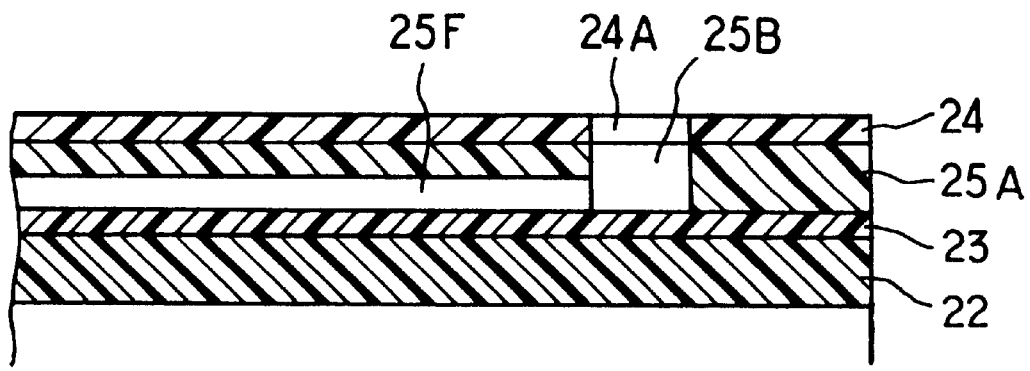
FIG._11
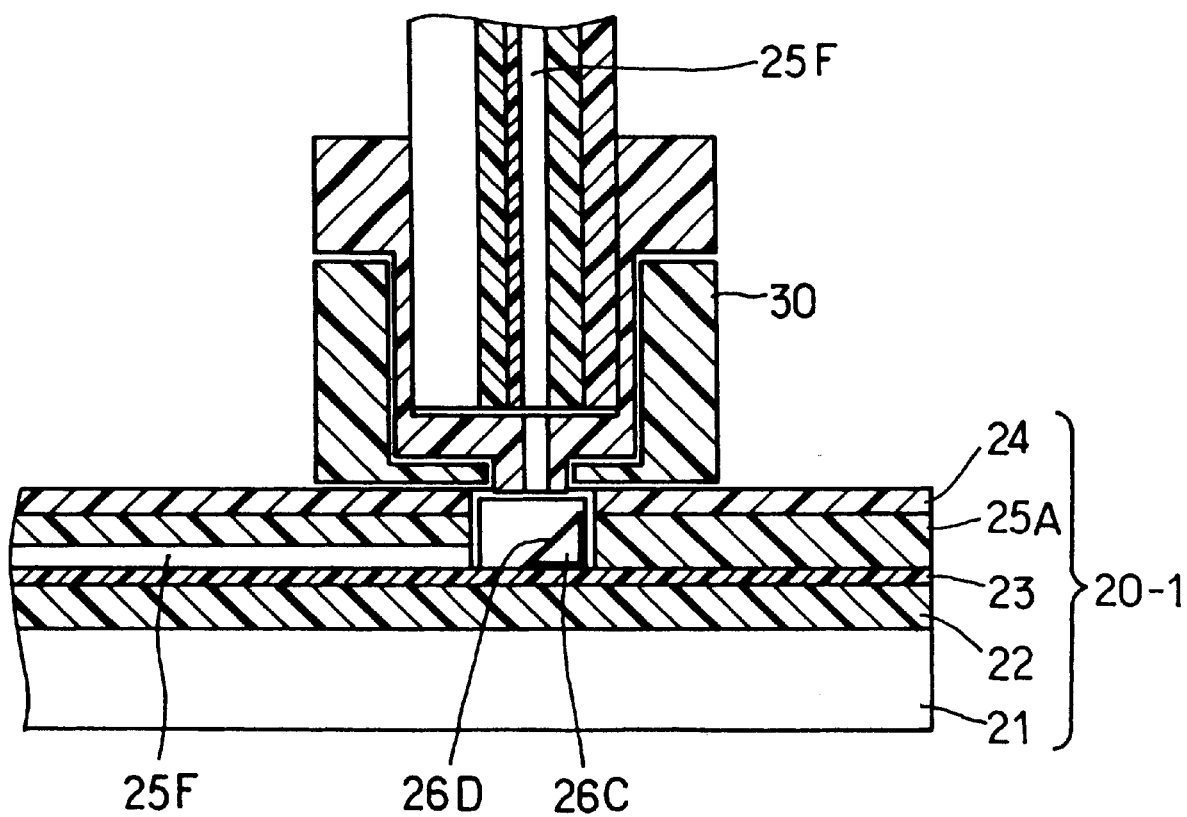
FIG._12

OPITCAL/ELECTRICAL HYBRID WIRING BOARD AND ITS MANUFACTURING METHOD

BACKGROUND OF THE INVENTION

This invention relates to an electro-optical hybrid wiring board suitable for use to handle both optical and electrical signals, and a method for making same.

There have evolved examples in which a portion of an apparatus is constructed of optical circuits for the purpose of increasing the response speed of the apparatus, eliminating the interference between the circuits, or the like.

An example of the construction of the prior art electro-optical hybrid apparatus is illustrated in FIG. 1 in which the reference numeral 11 indicates a mother board while 12 are daughter boards mounted to the major surface of the mother board 11 in an orientation perpendicular to the plane of the mother board. The daughter boards 12 are electrically connected with the mother board 11 by means of electrical connectors 13 mounted to the major surface of the mother board 11.

On the other hand, the interconnections between the daughter boards 12 for optical signals are separately established by optical communication modules 15 and optical fibers 16.

In the conventional electro-optical hybrid apparatus, while the electrical interconnections between the daughter boards are collectively effected by the electrical connectors 13 and mother board 11, optical signal interconnections must be made separately for each route by means of the optical communication modules 15 and optical fibers 16. The optical communication modules 15 and optical fibers 16 are configured to be detachably connected together by optical connectors 17. However, for a large scale apparatus such as an IC tester, a tremendous amount of labor is required for the connecting and disconnecting operations because of the great number of optical signal paths which may amount to as many as several thousands. Although there are available optical connectors capable of connecting and disconnecting a plurality of optical fibers at one time, such configuration of connection could not cope with an enormous number of optical signal paths as many as several thousands. In addition, misconnections are likely to occur, and undesirably much labor is required for the assembly.

Wim Delbare and Louis Vandam deals with the configuration of connection for numerous glass optical fibers embedded in the surface layer of an electro-optical board in their "ELECTRO-OPTICAL BOARD TECHNOLOGY BASED ON DISCRETE WIRING", Proc. International Electronic Packaging Conf., pp. 604–618, 1991. According to this connecting method, a supporting glass fiber (or copper wire) is laid on a wiring board to extend in a straight line and a plurality of glass optical fibers are arrayed so as to cross perpendicularly over the supporting glass fiber whereby the optical fibers will have bent portions protruding upwardly. These fibers are then embedded in a filler layer to form an electro-optical board (daughter board ). The upper surface of the filler layer is shaved to expose the raised bent portions of the fibers, which raised portions are ground to form optical coupling faces, against which optical couplers disposed in a mother board are opposed to optically connect the optical fibers of the electro-optical board with those of the wiring board (mother board) oriented perpendicularly to the electro-optical board. This connecting approach allows for collectively interconnecting numerous optical fibers between a mother board and daughter boards, but is involved with difficulties in grinding many arrayed bent portions of optical fibers by the same depth to the cores of the optical fibers and consequently suffers from the drawback of significant variation in the optical coupling characteristics.

SUMMARY OF THE INVENTION

Accordingly, it is an object of this invention to provide an electro-optical hybrid wiring board which permits collective connection and disconnection of optical signal paths with reduced variation in the optical coupling characteristics as well as electrical circuits and which is easy to manufacture, and a method for making same.

According to this invention, an optical fiber-embedded layer having optical fibers embedded therein is provided as one layer of a multiple-layered electrical wiring board. A plurality of end faces of the optical fibers laid in that layer are exposed at the lateral end of the insulating substrate of the wiring board to form a lateral end coupling to allow for optical coupling at the lateral end in a direction parallel to the plane of the substrate. The other end faces of the optical fibers laid in the optical fiber-embedded layer are also exposed to provide a surface coupling to allow for optically coupling the other end faces in a direction orthogonal to the plane of the insulating substrate. It will thus be appreciated that by virtue of the combination of the lateral end coupling and the surface coupling, this invention provides for both electrical and optical direct connections between boards positioned orthogonally with each other such as in the relation between the mother board and the daughter boards.

The electro-optical hybrid wiring board according to this invention comprises:

an insulating substrate having an adhesive layer formed on one side surface thereof;

a plurality of optical fibers first end portions of which are arranged on the insulating substrate and laid in a predetermined pattern over the surface of the insulating substrate and attached to the adhesive layer;

a filler layer applied in a thickness sufficient to fill up undulations of the surface defined by the array of the optical fibers;

a covering sheet applied to the filler layer;

window means formed through the filler layer and the covering sheet to expose the first end portions of the optical fibers;

reflecting means for reflecting light exiting from the first end portions of the optical fibers perpendicularly to the plane of the insulating substrate within the window means and directing the light out of the covering sheet through the window means, and/or reflecting light entered through the window means from outside of the covering sheet perpendicularly to the plane of the substrate and directing the light at a right angle into the first end portions of the optical fibers; and an electrical wiring sheet laminated to the other side surface of the insulating substrate.

A method for manufacturing an electro-optical hybrid wiring board according to this invention comprises the steps of:

(a) applying adhesive to one side surface of an insulating substrate to form an adhesive layer;

(b) laying a plurality of optical fibers in a predetermined pattern over the surface of the adhesive layer while attaching the fibers to the adhesive layer, and applying a filler material in a thickness sufficient to encapsulate the optical fibers; and (c) applying a covering sheet to the top surface of the filler material.

The electro-optical hybrid wiring board according to this invention provides for coupling optical signals between boards positioned in orthogonal relation with each other whereby the variation in the positional alignment may be minimized.

The invention also provides a method for easily manufacturing such electro-optical hybrid wiring board with little variation in the optical coupling characteristics.

BRIEF DESCRIPTION OF THE DRAWINGS

FIG. 1 is a perspective view illustrating the prior art technique;

FIG. 2 is a plan view illustrating one embodiment of the electro-optical hybrid wiring board of this invention;

FIG. 3 is a side view of the embodiment of the electro-optical hybrid wiring board shown in FIG. 2;

FIG. 4 is a cross-sectional view taken along line 4—4 of FIG. 2 illustrating a practical embodiment of the electro-optical hybrid wiring board;

FIG. 5 is a perspective view illustrating one example of the method of forming an optical fiber-embedded layer for use with the electro-optical hybrid wiring board of this invention;

FIG. 6 is a cross-sectional view illustrating the configuration of connections of the electrical wiring sheet of the electro-optical hybrid wiring board of this invention;

FIG. 7 is a cross-sectional view taken along line 7—7 of FIG. 2 illustrating the electrical connections;

FIG. 8 is a cross-sectional view illustrating another practical embodiment of the electro-optical hybrid wiring board of this invention;

FIG. 9 is a cross-sectional view illustrating an embodiment of the construction of the electrical connector for use with the electro-optical hybrid wiring board of this invention;

FIG. 10 is a cross-sectional view illustrating a modified embodiment of the surface coupling provided in the electro-optical hybrid wiring board of this invention;

FIG. 11 is a cross-sectional view illustrating the process of producing another modified embodiment of the surface coupling provided in the electro-optical hybrid wiring board of this invention; and FIG. 12 is a cross-sectional view illustrating the construction of the surface coupling made by the process shown in FIG. 11.

DETAILED DESCRIPTION OF THE PREFERRED EMBODIMENTS

FIGS. 2 and 3 illustrate in plan and side views, respectively the electro-optical hybrid wiring board according to this invention together with a plurality of connectors mounted to the wiring board and cables connected with those connectors. An electro-optical hybrid connector housing 35A mounted to one lateral end of the electro-optical hybrid wiring board 20-1 (which will also be referred to as mother board herein below) is adapted to mate with a connector plug 35B attached to an end of an electro-optical hybrid cable 36, for example to constitute an electro-optical hybrid connector 35. An electric connector housing 33A and an optical connector housing 31A mounted to the opposite lateral end of the wiring board are adapted to mate with an electrical connector plug 33B and an optical connector plug 31B, respectively attached to ends of associated electrical and optical cables 34 and 32 to constitute an electrical connector 33 and an optical connector 31, respectively.

A plurality of positioning housings 30 are arranged in parallel with each other on the surface of the wiring board 20-1. Each of the positioning housings 30 is formed at its top with a slot 30A for receiving one end of a daughter board 20-2 and has securing plate-like portions 30B extending integrally outwardly from the opposite ends of the housing 30 at the bottom thereof. The securing plate-like portions 30B are used to fasten the housing 30 to the mother board 20-1 by screws 30P. In the example illustrated, electronic elements 21E are also mounted to the surfaces of the wiring board 20-1.

FIG. 4 shows an enlarged cross-sectional view taken along line 4—4 extending through the electrical connector 31. Illustrated in the embodiment of FIG. 4 are the construction of a surface optical coupling 26 provided in the major surface of the electro-optical hybrid wiring board 20-1 and a lateral end optical coupling 27 provided at the lateral end of the wiring board. The surface optical coupling 26 is configured to establish optical connection between the electro-optical hybrid wiring board 20-1 serving as a mother board and the electro-optical hybrid wiring board 20-2 functioning as a daughter board. The mother board 20-1 comprises an electrical wiring sheet 21, an insulating sheet 22 overlying the wiring sheet, an adhesive layer 23 overlying the insulating sheet, an optical fiber-embedded layer 25 formed on the adhesive layer, and a covering sheet 24 covering the optical fiber-embedded layer and having connection terminals disposed therein. Embedded in the optical fiber-embedded layer 25 are optical fibers 25F which may be made of plastic-based material. Each optical fiber forms part of the surface optical coupling 26 and the lateral end optical coupling 27 at the surface and the lateral end, respectively of the wiring board for receiving and transmitting optical signals.

An example of the method of forming the optical fiber-embedded layer 25 is diagrammatically illustrated in FIG. 5. An adhesive material is applied to one side of the insulating sheet 22 to form an adhesive layer 23. Optical fibers 25F are laid in a predetermined pattern over the surface of the adhesive layer 23 while attaching the fibers to the adhesive layer. This laying operation may be automatically accomplished by a fiber laying apparatus 28 which is maneuvered by X-Y driven arms (not shown). The optical fibers 25F being laid are large in number and may cross each other. However, the optical fibers do not permit leakage of light to the exterior even if they are not coated with light-shielding material. Accordingly, even though numerous optical fibers may be closely arranged and/or cross each other, there is no possibility of cross-leakage of signals.

Upon completion of the fiber laying, a filler layer 25A is applied in a thickness just enough to fill up the undulations of the surface defined by the optical fibers 25F thus laid, so that an optical fiber-embedded layer 25 is comprised of the optical fibers 25F and the filler layer 25A.

An end of each of the optical fibers 25F is formed with a slanted face S1 acting as a reflecting surface. The slanted face S1 may be preformed during the laying operation, and the optical fiber 25F may be attached to the adhesive layer 23 with the slanted face S1 formed by beveling facing toward the wiring board 21. When forming the filler layer 25A, that portion of the optical fiber 25F having the slanted face S1 is masked so that the slanted face S1 is not covered with the filler layer 25A.

A covering sheet 24 is applied to the top surface of the filler layer 25A once the latter has been solidified. The covering sheet 24 may be formed of the same insulating material as that of the insulating substrate 22. Formed on the top surface of the covering sheet 24 is an electrical wiring pattern with which are connected the electronic elements 21E, the electric connection terminals 30T for the positioning housings 30, the connection terminals 33T for the electric connector housing 33A, and the like as shown in FIGS. 2 and 3.

FIG. 6 shows a cross-sectional view taken along line 6—6 in FIG. 2. In this example, the electrical connections between the electronic elements 21E and the electrical wiring sheet 21 are effected by electrical conductor portions 21C filled in through-holes 21H as shown in FIG. 6. More specifically, the electrical wiring sheet 21 in the example shown in FIG. 6 is in the form of a multiple-layered wiring sheet comprising insulating layers 21A 1, 21A 2, 21A 3 and 21A 4 and wiring conductors 21B, 21B 2, 21B 3 and 21B 4 between the adjacent the insulating layers. The wiring conductors 21B, 21B 2, 21B 3 and 21B 4 are electrically connected at the various portions by filling the through-holes 21H with electrical conductor portions 21C as required. The connections between the electronic elements 21E mounted on the surface and the electrical wiring sheet 21 are made by the electrical conductor portions 21C. These connections may be realized by the electrical wiring technique conventionally used.

Referring back to FIG. 4, the covering sheet 24 and the filler layer 25A may be separately preformed with a window 24A and a window 25B communicatable with each other so as to expose the inner ends of the optical fibers 25F, and subsequently the covering sheet 24 may be aligned with and affixed to the filler layer 25A. Or alternatively, the two layers may be first laminated together and then the window 24A may be formed through the covering sheet 24 by photolithography.

Light may be either output from or input into the optical fibers 25F perpendicularly to the plane of the wiring board 20 by selecting the angle of inclination of the preformed slanted faces S1 of the optical fibers 25F at 45°. It is to be understood that the slanted faces S1 may be metallized by the selective plating process or otherwise to enhance the reflecting efficiency. The surface optical coupling 26 is constituted by the slanted faces S1 and the windows 24A and 25B.

The other end faces S2 of the optical fibers 25F are exposed at the lateral end 27A of the wiring board 20-1 to constitute the lateral end coupling 27. The optical fibers 25F may be on the order of 100–200 $\mu$m in diameter by being made of plastic-based material, for example. Accordingly, if plastic-made optical fibers having a diameter of 200 $\mu$m are used, even as many optical fibers as about one thousand may be placed in juxtaposition within a width of about 20 cm.

The arrangement is such that the optical fibers 25F1 on the side of one electro-optical hybrid wiring board 20-1 and the optical fibers 25F2 on the side of another electro-optical hybrid wiring board 20-2 may be aligned with respect to their optical axes by plugging the electro-optical hybrid wiring board 20-2 into the housing 30 mounted on the electro-optical hybrid wiring board 20-1. While the lower end of the electro-optical hybrid wiring board 20-2 may be directly inserted into the housing 30, a protective cap 29 having a radially extending flange 29F may be fitted over the lower end portion of the electro-optical hybrid wiring board 20-2 as in the example shown in FIG. 4 so that the wiring board with the cap 29 may be inserted into the housing 30. In this example the protective cap 29 further has optical fiber waveguides 25G embedded in and extending downwardly through its lower end so positioned as to mate with the end faces of the corresponding arrayed optical fibers 25F2 of the daughter board 20-2. Coextending with the optical fiber waveguides 25G downwardly from the bottom of the protective cap 29 is a protective guide portion 29G which is adapted to be inserted into the windows 24A and 25B formed in the mother board 20-1. With this arrangement, the lower end faces of the optical fiber waveguides 25G may be positioned in closely adjacent and opposed relation with the ends of the optical fibers 25F1 to imaprove the optical coupling efficiency.

Mounted to the lateral end of the electro-optical hybrid wiring board 20-1 is the housing 31A of the optical connector 31 into which the plug 31B of the optical connector 31 may be plugged to connect the optical fibers 25F1 and the optical fibers 25F3. It is thus to be appreciated that this arrangement provides for connection between the optical circuit mounted in the electro-optical hybrid wiring board 20-2 and the external optical circuit through the optical fibers 25F2, 25F1 and 25F3.

FIG. 7 shows the cross-sectional structure taken along line 7—7 through the electrical connector 33 and the housing 30 in FIG. 2. Formed on the wiring board 20-1 adjacent its lateral end is a conducting land 20L leading from the electrical circuit to which land are connected terminals 33T supported by the housing 33A forming part of the electrical connector 33. The terminals 33T are originated from the inner wall of the housing 33A to extend over the top and bottom surfaces of the wiring board 20-1. Within the housing 33A, the terminals 33T may be contacted by terminals 33V extending from the plug 33B to make electrical connection. The structure of the electrical connector 33 shown in FIG. 7 may be formed integrally with the optical connector 31 shown in FIG. 4 connectable with the lateral end optical coupling 27.

On the other hand, the electrical connection forming part of the positioning housing 30 for receiving the daughter board 20-2 includes connecting terminals 30T extending along the inner wall of the housing 30 and out through the housing wall in a L-shaped bend and terminating in lower ends soldered to conductor lands 20M formed on the surface of the mother board 20-1. Within the housing 30 the connecting terminals 30T are in contact with terminals 20T provided on the surface of the lower end of the daughter board 20-2.

FIG. 8 is a cross-sectional view taken along line 8—8 in FIG. 2 illustrating another embodiment in which a plurality of electro-optical hybrid wiring boards 20-2 are mounted on the electro-optical hybrid wiring boards 20-1 acting as a mother board and in which the optical circuits mounted in the plurality of electro-optical hybrid wiring boards 20-2 are interconnected utilizing the surface optical couplings 26 and the lateral end optical couplings 27. In this arrangement the optical fiber 25F1 is formed at its opposite ends with surface optical couplings 26 which are coupled with the lateral end optical couplings 27 provided on the associated electro-optical hybrid wiring boards 20-2. It will be appreciated that even if a multiplicity of daughter boards 20-2 are arranged on a mother board 20-1, this configuration allows for optically coupling together the optical circuits of the daughter boards through the optical fibers 25F1 embedded in the optical fiber-embedded layer 25 of the mother board.

FIG. 9 illustrates a modified form of the surface optical coupling 26 shown in the foregoing embodiments. In this modified embodiment, a cylindrical condensing lens 26A is disposed so as to be in alignment with the central axis of the optical fiber 25F2 whereby the advantages of enhancing the efficiency of optical coupling between the optical fibers 25F1 and 25F2 and hence the transmission efficiency are obtained.

FIG. 10 illustrates another modified form of the surface optical coupling 26. In this embodiment, optical fibers 25F2 are laid over an adhesive layer 23 and then covered by a filler layer 25A. Once the filler layer 25A has been solidified, a covering sheet 24 is applied and bonded to the filler layer 25A. A notch 26B (V-shaped groove) is formed in the thus formed lamination 24, 25A using a machining tool to sever the optical fibers 25F such that an end of each severed optical fiber defines a vertical end face while the other end defines a 45° slanted end face S1. If desired, the 45° slanted end face S1 may be metallized by the selective plating process or otherwise to provide a reflecting surface with enhanced reflecting efficiency.

It is to be understood that the optical fiber 25F may be coupled with vertically running light by the use of the 45° slanted end face S1 to input the light into or output the light from the optical fiber 25F.

FIG. 11 illustrates yet another modified form of the surface optical coupling 26. In this embodiment, after the covering sheet 24 has been applied to the filler layer 25A, aligned apertures 24A and 25B (virtually a groove) are formed through the covering sheet 24 and filler layer 25A. During this cutting process, the arrayed optical fibers 25F are simultaneously severed vertically, and then the cut end faces of the optical fibers are polished. Subsequently, as shown in FIG. 12, a prism-like resin block 26C with a 45° total reflection surface 26D elongated across the optical fiber array is mounted in the aligned apertures 24A and 25B so that the optical fibers 25F may be coupled together via the 45° reflection surface 26D.

EFFECTS OF THE INVENTION

As discussed above, according to this invention, an optical fiber-embedded layer 25 having optical fibers 25F embedded therein is provided integrally with the electrical wiring board in such a manner that the optical fibers 25F embedded in the layer 25 can be coupled with exterior optical fibers in a direction orthogonal with the plane of the wiring board, whereby the alignment in position of the positioning housings 30 is facilitated to correspondingly reduce the variation in the optical coupling characteristics. By way of example, transmission paths for optical signals exchanged between a mother board and daughter boards or between daughter boards may be easily interconnected simply by plugging a plurality of daughter boards into the mother board. It is thus to be appreciated that even multiple-channelled optical signal paths may be easily assembled with less maintenance services required.

What is claimed is:

1. An electro-optical hybrid wiring board comprising:
   an insulating substrate having an adhesive layer formed on one surface thereof;
   a plurality of outer connecting discrete optical fibers attached to said adhesive layer in a predetermined pattern, each of said optical fibers having a first end portion and a second end portion opposite to the first end portion, said first end portions of which are arrayed on said adhesive layer at a middle portion thereof and said second end portions of which are arrayed on said adhesive layer at a lateral end portion thereof;
   a filler layer applied with a filler material in a thickness sufficient to fill up undulations of surfaces of said optical fibers;
   a covering sheet formed on said filler layer;
   window means formed at the middle surface portion of the adhesive layer in the filler layer and the covering sheet to expose the first end portions of said optical fibers; and
   reflecting means for reflecting incident light entering thereto from the first end portions of said optical fibers at a right angle so as to direct reflected, light into a direction perpendicular to the one surface of the insulating substrate out of said covering sheet through the window means, and reflecting light entering thereto through the window means from outside of said covering sheet in the direction perpendicular to the one surface of said substrate at a right angle so as to direct reflected light through the first end portions into said optical fibers; and
   an electrical wiring sheet laminated to the other surface of said insulating substrate and having an electric wiring pattern;
   whereby optical elements can be mounted on said covering sheet above the window openings so as to be connected to the optical fibers while electronic elements can he mounted on said electrical wiring sheet so as to be connected to the electric wiring pattern in hybrid manner.

2. The electro-optical hybrid wiring board of claim 1 wherein, said reflecting means is formed at the first end portions of said optical fibers and includes a severed face inclined at 45° with respect to the axes of said optical fibers and facing toward said insulating substrate.

3. The electro-optical hybrid wiring board of claim 1 wherein, the first end portions of said optical fibers have end faces perpendicular to the axes of said optical fibers, and said reflecting means being a reflector having a reflecting surface opposing the first end portions of said optical fibers at 45°.

4. The electro-optical hybrid wiring board of claim 3 wherein, said reflector comprises an optical fiber segment severed off from each of said optical fibers.

5. The electro-optical hybrid wiring board of claim 3 wherein, said reflector comprises a unitary prism-like reflector extending in opposing relation with the first end portions of said optical fibers.

6. The electro-optical hybrid wiring board of any one of claims 1 to 5 including a positioning housing secured to said covering sheet, said positioning housing having a hollow interior surrounding said window means over said covering sheet, said hollow interior being adapted to receive a lateral end portion of a daughter board, said daughter board having a plurality of optical fibers, each optical fiber having an end arranged in said lateral end portion.

7. The electro-optical hybrid wiring board of any one of claims 1 to 5 wherein, said optical fibers are plastic optical fibers.

8. The electro-optical hybrid wiring board of any one of claims 1 to 5 wherein, a condensing lens is disposed above said reflecting means.

9. The electro-optical hybrid wiring board of any one of claims 1 to 5 wherein,
   said insulating substrate, said filler layer, said covering sheet and said electrical wiring sheet constitute a mother board, and
   said optical fibers have, at their second end portions, end faces flush with one lateral end face of said mother board to define a lateral end coupling for optical coupling with exterior optical fibers.

10. The electro-optical hybrid wiring board of claim 9 including a connector housing secured to the one lateral end face of said mother board, said connector housing having a hollow interior surrounding said lateral end coupling of said optical fibers, said hollow interior being adapted to receive a connector plug of an exterior optical cable.

11. A method for manufacturing an electro-optical hybrid wiring board comprising the steps of:

(a) applying adhesive to one surface of an insulating substrate to form an adhesive layer;

(b) attaching a plurality of discrete optical fibers in a predetermined pattern to a top surface of said adhesive layer, each of said optical fibers having a first end portion at which reflecting means with a slanted reflective face is provided for reflecting incident light entering thereto from the optical fiber at a right angle to a direction of incidence of the incident light, and attachment of the respective optical fiber to the adhesive layer being performed in such a manner that each of the reflecting means corresponding to the respective optical fibers directs reflected light in a direction perpendicular to said one surface of the insulating substrate;

(c) masking the reflective means and applying a filler material in a thickness sufficient to encapsulate said optical fibers to thereby form a filler layer on said adhesive layer with a top flat surface thereof which has window openings for exposing the reflecting means;

(d) applying to the top surface of the filler layer an insulator covering sheet having window openings for exposing the reflecting means; and (e) forming an electric wiring pattern on the covering sheet, whereby optical elements can be mounted on said covering sheet above the window openings so as to be connected to the optical fibers while electronic elements can be mounted on said covering sheet so as to be connected to the electric wiring pattern in hybrid manner.

12. A method for manufacturing an electro-optical hybrid wiring board comprising the steps of:

(a) applying adhesive to one surface of an insulating substrate to form an adhesive layer;

(b) attaching a plurality of discrete optical fibers in a predetermined pattern onto a top surface of said adhesive layer, each of said optical fibers having a first end portion at which reflecting means with a slanted reflective face is provided for reflecting light incident thereto from the optical fiber at a right angle to a direction of incidence of the incident light, and attachment of the respective optical fibers to the adhesive layer being performed in such a manner that each of the reflecting means corresponding to the respective optical fibers directs reflected light in a direction perpendicular to said one surface of the insulating substrate;

(c) masking the reflective means and applying a filler material in a thickness sufficient to encapsulate said optical fibers to thereby form a filler layer on said adhesive layer with a top flat surface thereof which has window openings for exposing the reflecting means;

(d) applying to the top surface of the filler layer an insulator covering sheet having window openings for exposing the reflecting means;

(e) after said covering sheet has been applied to said filler layer, forming a V-shaped groove through said covering sheet to a depth sufficient to server said optical fibers such that one end of each optical fiber defined by formation of said V-shaped groove has an end face normal to the axis of said optical fiber while the cut face of an optical fiber segment severed off from said optical fiber opposing said normal end face defines a 45° slanted reflecting surface to form a surface coupling for allowing light transmitted through optical fiber to be output from and input into said optical fiber in a direction orthogonal with the plane of said covering sheet.

13. An electro-optical hybrid wiring board comprising:

an insulating substrate having an adhesive layer formed on one surface thereof;

a plurality of outer connecting discrete optical fibers attached to said adhesive layer in a predetermined pattern, each of said optical fibers having a first end portion and a second end portion opposite to the first end portion, said first end portions of which are arrayed on said adhesive layer at a middle portion thereof and said second end portions of which are arrayed on said adhesive layer at a lateral end portion thereof;

a filler layer applied with a filler material in a thickness sufficient to fill up undulations of surfaces of said optical fibers;

a covering sheet formed on said filler layer;

window openings formed at the middle surface portion of the adhesive layer in the filler layer and the covering sheet to expose the first end portions of said optical fibers; and reflecting means for reflecting light entering thereto from the first end portions of said optical fibers at a right angle so as to direct reflected light into a direction perpendicular to the one surface of the insulating substrate out of said covering sheet through the window openings, and reflecting light entering thereto through the window openings from outside of said covering sheet in the direction perpendicular to the one surface of said substrate at a right angle so as to direct reflected light through the first end portions into said optical fibers; and an electric wiring pattern formed on the covering sheet; whereby optical elements are mounted on said covering sheet above the window openings so as to be connected to the optical fibers while electronic elements are mounted on said covering sheet so as to be connected to the electric wiring pattern in hybrid manner.

14. An electro-optical hybrid wiring board comprising:

a board member which comprises:
 which comprises:
 an insulating substrate having an adhesive layer formed on one surface thereof;
 a plurality of outer connecting discrete optical fibers attached to said adhesive layer in a predetermined pattern, each of said optical fibers having a first end portion and a second end portion opposite to the first end portion, said first end portions of which are arrayed on said adhesive layer at a middle portion thereof and said second end portions of which are arrayed on said adhesive layer at a lateral end portion thereof;
 a filler layer applied with a filler material in a thickness sufficient to fill up undulations of surfaces of said optical fibers;
 a covering sheet formed on said filler layer;

window openings formed at the middle portion of the adhesive layer in the filler layer and the covering sheet to expose the first end portions of said optical fibers;

reflecting means for reflecting light entering thereto from the first end portions of said optical fibers at a right angle so as to direct reflected light into a direction perpendicular to the one surface of the insulating substrate out of said covering sheet through the window openings, and reflecting light entering thereto through the window openings from outside of said covering sheet in the direction perpendicular to the one surface of said substrate at a right angle so as to direct reflected light through the first end portions into said optical fibers; and an electrical wiring sheet laminated to the other surface of said insulating substrate and having an electric wiring pattern; and at least one positioning housing for receiving an electro-optical hybrid wiring daughter board to which both electronic elements with electric connecting means therefor and optical elements with optical connecting means therefor are equipped; wherein said positing housing is mounted on said covering sheet above said window openings in such a manner that the reflecting means lying thereunder is coupled to the optical element of the daughter board through the optical connecting means therefor when said positioning housing receives the daughter board; and said positioning hosing has first contact means connected to the electrical wiring pattern of the electric wiring sheet, whereby, when said daughter board is received by said positioning housing, electric connection between the electric wiring pattern of the electrical wiring sheet and the electronic elements on the daughter board by means of the first contact means and the electric connecting means and optical connection between the optical fibers and the optical elements on the daughter board by means of the reflecting means and the optical connecting means are concurrently attained.

15. An electro-optical hybrid wiring board comprising:
a board member which comprises:
an insulating substrate having an adhesive layer formed on one surface thereof;
a plurality of outer connecting discrete optical fibers attached to said adhesive layer in a predetermined pattern, each of said optical fibers having a first end portion and a second end portion opposite to the first end portion, said first end portions of which are arrayed on said adhesive layer at a middle portion thereof and said second end portions of which are arrayed on said adhesive layer at a lateral end portion thereof;
a filler layer applied with a filler material in a thickness sufficient to fill up undulations of surfaces of said optical fibers;
a covering sheet formed on said filler layer;
window openings formed at the middle portion of the adhesive layer in the filler layer and the covering sheet to expose the first end portions of said optical fibers;
reflectings means for reflecting light entering thereto from the first end portions of said optical fibers at a right angle so as to direct reflected light into a direction perpendicular to the one surface of the insulating substrate out of said covering sheet through the window openings, and reflecting light entering thereto through the window openings from outside of said covering sheet in the direction perpendicular to the one surface of said substrate at a right angle so as to direct reflected light through the first end portions into said optical fibers; and an electric wiring pattern formed on the covering sheet; and at least one positioning housing for receiving an electro-optical hybrid wiring daughter board to which both electronic elements with electric connecting means therefor and optical elements with optical connecting means therefor are equipped; wherein said positioning is mounted on said covering sheet above said window openings in such a manner that the reflecting means lying thereunder is coupled to the optical element of the daughter board through the optical connecting means therefor when said positioning housing receives the daughter board; and said positioning housing has first contact means connected to the electric wiring pattern, whereby, when said daughter board is received by said positioning housing, electric connection between the electric wiring pattern and the electronic elements on the daughter board by means of the first contact means and electric connecting means for the electronic elements and optical connection between the optical fibers and the optical elements on the daughter board by means of the reflecting means and the optical connecting means are concurrently attained.

16. An electro-optical hybrid wiring board comprising:
a board member;
which comprises:
an insulating substrate having an adhesive layer formed on one surface thereof;
a plurality of internally connecting discrete optical fibers attached to said adhesive layer in a predetermined pattern, each of said optical fibers having a first end portion and a second end portion opposite to the first end portion,
a plurality of reflecting means each provided in correspondence to the first and second end portions of the internally connecting optical fibers for reflecting incident light entering thereto at a right angle so that incident light entering thereto from the optical fiber provides reflected light outputting therefrom in a direction perpendicular to said one surface of said insulating substrate and vice versa;
a filler layer formed on said adhesive layer with a filler material in a thickness sufficient to fill up undulations of surfaces of said optical fibers;
a covering sheet formed on said filler layer;
window openings formed in the filler layer and the covering sheet to expose the reflecting means provided in correspondence to the first and second end portions of said internally connecting optical fibers in the direction perpendicular to said one surface of said insulating substrate; and
an electric wiring pattern formed on the covering sheet; and
at least two positioning housings each mounted on said board member for receiving a daughter board to which at least one optical element with optical connecting means therefor is equipped; wherein
each of said internally connecting optical fibers is attached to the adhesive layer so as to position between two positioning housing, and the reflecting means corresponding to one of the first and second end portions of each of said internally connecting fibers positioned between two positioning housings is optically connected to the optical element on one daughter board through the optical connecting means therefor when said one daughter board is received by its associated positioning housing, while the reflecting means corresponding to the other one of the first and second end portions of each of said internally connecting optical fibers positioned between the two positioning housings is optically connected to the optical element on other daughter board through the optical connecting means therefor when said other daughter board is received by its associated positioning housing, whereby, when each of said two positioning housings receives the daughter board, respectively, the optical elements on the two daughter boards are optically connected together through the internally connecting optical fibers positioned between said two positioning housings and the optical connecting means for the respective optical elements.

17. An electro-optical hybrid wiring board comprising:

a board member wherein which comprises:

an insulating subatrate having an adhesive layer formed on one surface thereof;

a plurality of internally connecting discrete optical fiber attached to said adhesive layer in a predetermined pattern, each of said optical fibers having a first end portion and a second end portion opposite to the first end portion, a plurality of reflecting means each provided in correspondence to the first and second end portion of the internally connecting optical fibers for reflecting incident light entering thereto at a right angle so that incident light entering thereto from the optical fiber provides reflected light outputting therefrom in a direction perpendicular to said one surface of said insulating substrate an vice versa;

a filler layer formed on said adhesive layer with a filler material in a thickness sufficient to fill up undulations of surfaces of said optical fibers;

a covering sheet formed on said filler layer;

window openings formed in the filler layer and the covering sheet to expose the first and second end portions of said internally connecting optical fibers in the direction perpendicular to said one surface of said insulating substrate; and an electrical wiring sheet laminated to the other surface of said insulating substrate; and at least two positioning housings each mounted on said board member for receiving a daughter board to which st least one optical element with optical connecting means therefor is equipped; wherein each of said internally connecting optical fibers is attached to the adhesive layer so as to position between two positioning housings, and the reflecting means corresponding to one of the first and second end portions of each of said internally connecting optical fibers positioned between two positioning housings is optically connected to the optical element on one daughter board through the optical connecting means therefor where said one daughter board is received by its associated positioning housing, while the reflecting means corresponding to the other one of the first and second end portions of each of said internally connecting optical fibers positioned between the two positioning housings is connected to the optical element on other daughter board through the optical connecting means therefor when said other daughter board is received by its associated positioning housing, whereby, when each of said two positoning housings receives the daughter board, respectively, the optical elements on the two daughter boards are optically connected together through the internally connecting optical fibers positoned between said two positioning housings and the optical connecting means for the respective optical elements.

18. A method for manufacturing an electro-optical bybrid wiring board comprising the steps of:

(a) applying adhesive to one surface of an insulating substrate to form an adhesive layer;

(b) attaching a plurality of discrete optical fibers in a predetermined pattern to a top surface of said layer, each of said optical fibers having a first end portion at which reflecting means with a slanted reflective face is provided for reflecting incident light entering thereto from the optical fiber at a right angle to a direction of incidence of the incident light, and attachment of the respective optical fibers to the adhesive layer being performed in such a manner that each of the reflecting means corresponding to the respective optical fibers directs reflected light in a direction perpendicular to said one surface of the insulating substrate;

(c) masking the reflecting means and applying a filler material in a thickness sufficient to encapsulate said optical fibers to thereby form a filler layer on said adhesive layer with a top flat surface thereof which has window openings for exposing the reflecting means;

(d) applying to the top surface of the filler layer an insulator covering sheet having window openings for exposing the reflectings means; and (e) forming an electrical wiring sheet laminated on the other surface of said insulating substrate and having an electric wiring pattern;

whereby optical elements can be mounted on said covering sheet above the window openings so as to be connected to the optical fibers while electronic elements can be mounted on said electrical wiring sheet so as to be connected to the electric wiring pattern in hybrid manner.

* * * * *